(12) United States Patent
Curtin

(10) Patent No.: US 11,499,923 B2
(45) Date of Patent: Nov. 15, 2022

(54) ON-CHIP PHOTONIC INTEGRATED CIRCUIT OPTICAL VALIDATION

(71) Applicant: OpenLight Photonics, Inc., Goleta, CA (US)

(72) Inventor: Benjamin M. Curtin, Santa Barbara, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

(21) Appl. No.: 17/038,422

(22) Filed: Sep. 30, 2020

(65) Prior Publication Data

US 2022/0099590 A1 Mar. 31, 2022

(51) Int. Cl.
| | |
|---|---|
| G01N 21/95 | (2006.01) |
| G01N 21/47 | (2006.01) |
| H04N 5/33 | (2006.01) |
| H04N 7/18 | (2006.01) |
| G02B 6/12 | (2006.01) |
| H01S 5/026 | (2006.01) |

(52) U.S. Cl.
CPC ............. *G01N 21/95* (2013.01); *G01N 21/47* (2013.01); *H04N 5/33* (2013.01); *H04N 7/183* (2013.01); *G01N 2201/06113* (2013.01); *G02B 6/12004* (2013.01); *H01S 5/0262* (2013.01)

(58) Field of Classification Search
CPC .............. G01N 21/95; G01N 21/47; G01N 2201/06113; H04N 7/183; H04N 5/33; H01S 5/0262; G02B 6/12004
See application file for complete search history.

(56) References Cited

U.S. PATENT DOCUMENTS

| | | | |
|---|---|---|---|
| 6,335,629 B1 | 1/2002 | Lee et al. | |
| 6,879,386 B2 | 4/2005 | Shurgalin et al. | |
| 7,567,740 B2 | 7/2009 | Bayindir et al. | |
| 7,872,489 B2* | 1/2011 | Dickson ............... | G01R 31/311 |
| | | | 324/758.02 |
| 2009/0079983 A1* | 3/2009 | Fujimori .......... | G01N 21/95607 |
| | | | 356/369 |

(Continued)

FOREIGN PATENT DOCUMENTS

| | | |
|---|---|---|
| CN | 114337828 A | 4/2022 |
| JP | 2022058070 A | 4/2022 |

(Continued)

OTHER PUBLICATIONS

"European Application Serial No. 20215083.5, Extended European Search Report dated May 31, 2021", 8 pgs.

(Continued)

*Primary Examiner* — Richard A Hansell, Jr.
(74) *Attorney, Agent, or Firm* — Schwegman Lundberg & Woessner, P.A.

(57) ABSTRACT

Photonic errors in a photonic integrated circuit can be imaged using an on-chip light source integrated in a photonic layer of the circuit. The on-chip light source can generate light at wavelengths that propagates through one or more substrate layers to an image sensor sensitive to the wavelength range. The on-chip light source can be tunable and provide different power settings that can be utilized to detect different types of optical errors in the photonic integrated circuit.

20 Claims, 11 Drawing Sheets

(56) References Cited

U.S. PATENT DOCUMENTS

| | | | |
|---|---|---|---|
| 2009/0245322 A1* | 10/2009 | Hudgings | G01M 11/30 |
| | | | 356/73.1 |
| 2013/0242294 A1* | 9/2013 | Taniguchi | G01N 21/95623 |
| | | | 356/237.5 |
| 2020/0319030 A1* | 10/2020 | Hudson | H01S 5/042 |
| 2021/0257396 A1* | 8/2021 | Piggott | H01L 27/1464 |
| 2021/0281046 A1* | 9/2021 | Heim | G01B 9/02004 |
| 2021/0281048 A1* | 9/2021 | Heim | H01S 5/0239 |

FOREIGN PATENT DOCUMENTS

| | | |
|---|---|---|
| TW | 202215733 A | 4/2022 |
| WO | 2019083773 | 5/2019 |

OTHER PUBLICATIONS

Egorov, A A, "Waveguide light scattering method as a best way for research of the statistic irregularities of integratedoptical waveguide", Journal of Radio Electronics, (Jul. 1, 2010), 1-19.

* cited by examiner

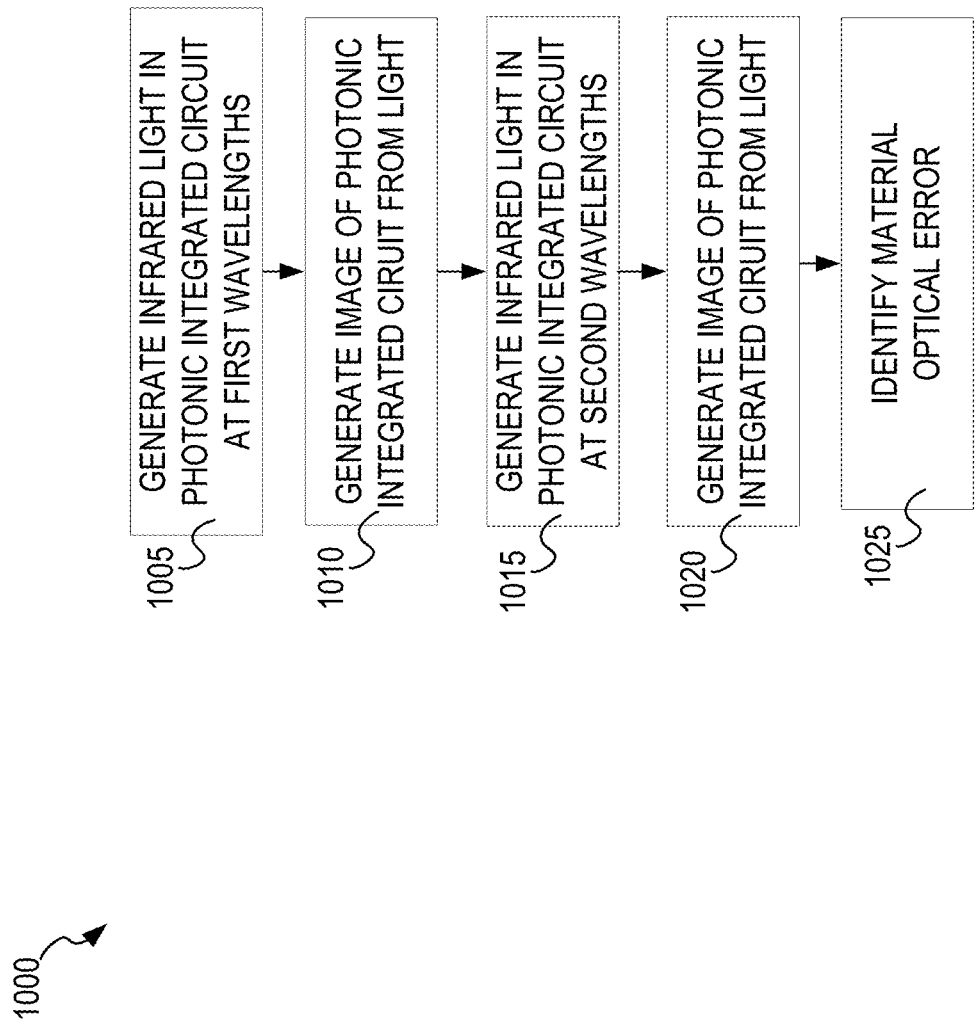

US 11,499,923 B2

ON-CHIP PHOTONIC INTEGRATED CIRCUIT OPTICAL VALIDATION

TECHNICAL FIELD

The present disclosure generally relates to optical circuits, and more particularly to optical circuit validation and error detection.

BACKGROUND

Photonic integrated circuits (PICs) can contain both active and passive components that are interconnected by waveguides, which can be damaged during fabrication of the PICs. Identifying the location of defects requires testing that can potentially destroy the PIC under analysis. Additionally, such testing occurs after fabrication in disassembled or exposed units which require preparation that slows down the design and fabrication processes. Additionally, such testing is late in the production cycle as significant costs have already been absorbed in the wafer fabrication stage of PIC manufacturing.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

FIG. 10 shows an example flow diagram of a method for determining material-based optical errors in a photonic integrated circuit, according to some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

As discussed, errors in photonic integrated circuits can be difficult to detect in the design and fabrication process. To this end, an on-chip light source based optical error detection system can generate photonic circuit images that can be used to identify one or more optical errors in a given PIC, at the wafer level and after die singulation and integrated into chip and chip packages. The on-chip light source can generate light at wavelengths that propagates through one or more substrate layers of the PIC to an image sensor sensitive to the wavelength range (e.g., infrared wavelengths). The on-chip light source can be tunable and provided different power settings that can be utilized to detect different types of optical errors in the photonic integrated circuit. The external camera can be implemented as an infrared CCD that can image the photonic circuit using the infrared light as the light illuminates the photonic circuit layer and further scatters out a side of the photonic circuit (e.g., passes through substrate layers, where the light scatters due to bends, holes, or anomalous materials.) In addition to error identification, the system can be implemented to validate that a PIC is functioning correctly in response to different light paths and components being activated (e.g., switching light paths in the PIC and confirming the light is propagating through the intended components).

Figure 1:
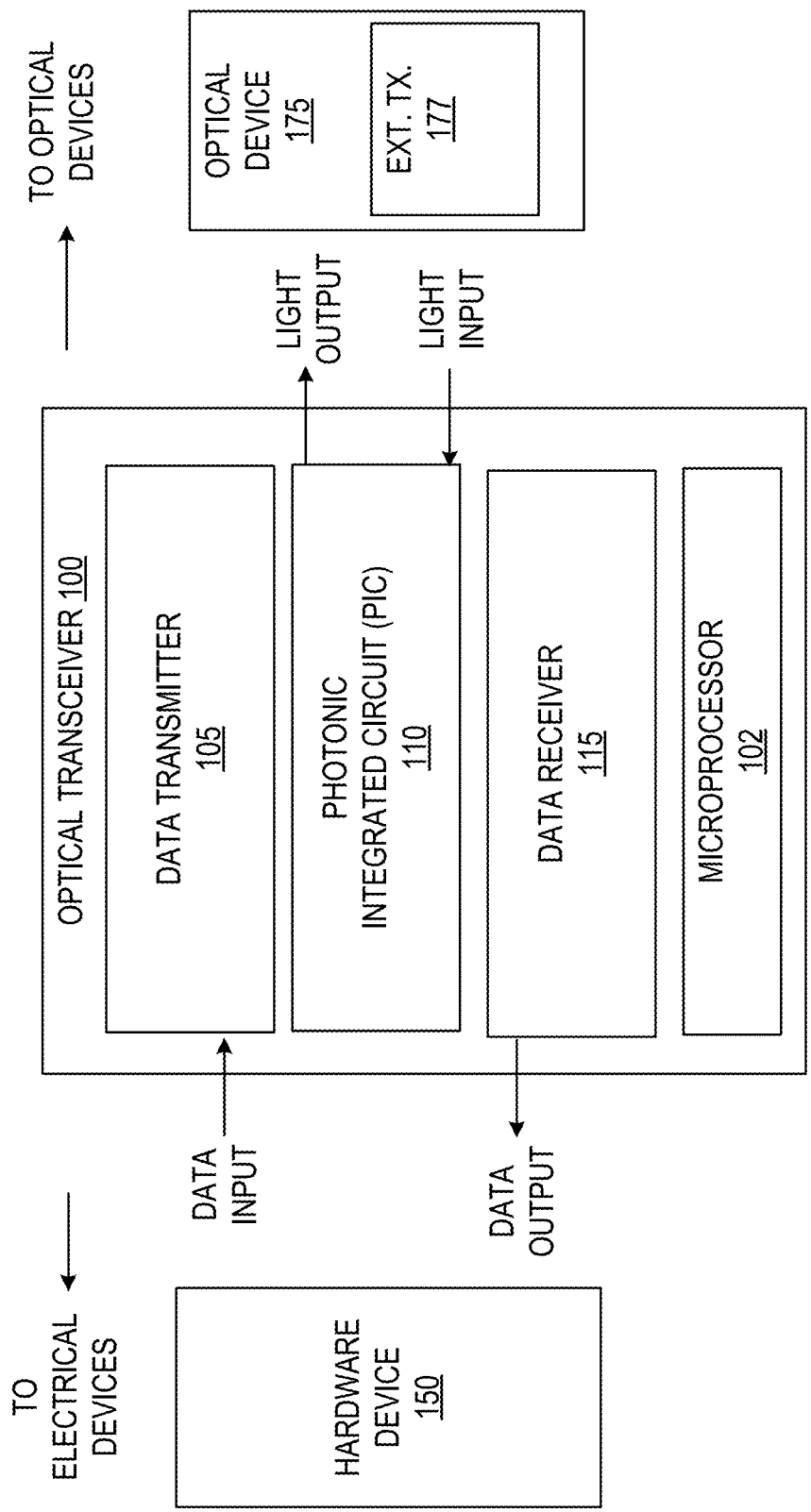
FIG. 1 is a block diagram illustrating an example optical transceiver for transmitting and receiving optical signals, according to some example embodiments.

FIG. 1 is a block diagram illustrating an example optical transceiver 100 for transmitting and receiving optical signals, according to some example embodiments. The optical transceiver 100 is an example of an optical-electrical device in which optical errors can be identified via infrared imaging of on-chip generated light, as discussed in further detail below. In the example illustrated in FIG. 1, the optical transceiver 100 processes data from electrical devices, such as electrical hardware device 150, converts the electrical data into optical data, and sends and receives the optical data with one or more optical devices, such as optical device 175. For example, the electrical hardware device 150 can be a host board that "hosts" the optical transceiver 100 as a pluggable device that sends and receives data to an optical switch network; where, for example, optical device 175 can be other components of an optical switch network (e.g., external transmitter 177). However, it is appreciated that the optical transceiver 100 can be implemented to interface with other types of electrical devices and optical devices. For instance, the optical transceiver 100 can be implemented as a single chip on a hybrid "motherboard" that uses an optical network (e.g., waveguides, fibers) as an optical bus to interconnect on-board electrical chips that process the data after it is converted from light into binary electrical data, according to some example embodiments.

In some example embodiments, the hardware device 150 includes an electrical interface for receiving and mating with an electrical interface of the optical transceiver 100. The optical transceiver 100 may be a removable front-end module that may be physically received by and removed from hardware device 150 operating as a backend module within a communication system or device. The optical transceiver 100 and the hardware device 150, for example, can be components of an optical communication device or system (e.g., a network device) such as a wavelength-division multiplexing (WDM) system or a parallel fiber system (e.g., parallel-single fiber (PSM)), according to some example embodiments.

In the example illustrated, the optical transceiver 100 includes a microprocessor 102 that controls electrical circuits (e.g., the data transmitter 105, the data receiver 115) and optical components such as the PIC 110.

The data transmitter 105 of the optical transceiver 100 can receive the electrical signals, which are then converted into optical signals via optical transmitter components (e.g., modulator, heater) of a photonic integrated circuit (PIC) 110. The PIC 110 can then output the optical signals via optical links, such as fiber or waveguides that interface with the PIC 110. The output light data can then be processed by other components (e.g., switches, endpoint servers, other embedded chips of a single embedded system), via a network such as a wide area network (WAN), optical switch network, optical waveguide network in an embedded system, and others.

In receiver mode, the PIC 110 (e.g., photodetector) can receive high data rate optical signals via one or more optical links to optical device 175. The optical signals are converted by the optical receiver components in the PIC 110 (e.g., SOA, photodiode), to convert from light into electrical signals for further processing by data receiver 115, such as demodulating the data into a lower data rate for output to other devices, such as the electrical hardware device 150. The modulation used by the optical transceiver 100 can include pulse amplitude modulation (e.g., 4-level PAM, such as "PAM4", PAM8, and so on), quadrature phase-shift keying (QPSK), binary phase-shift keying (BPSK), polarization-multiplexed BPSK, M-ary quadrature amplitude modulation (M-QAM), and others.

Figure 2:
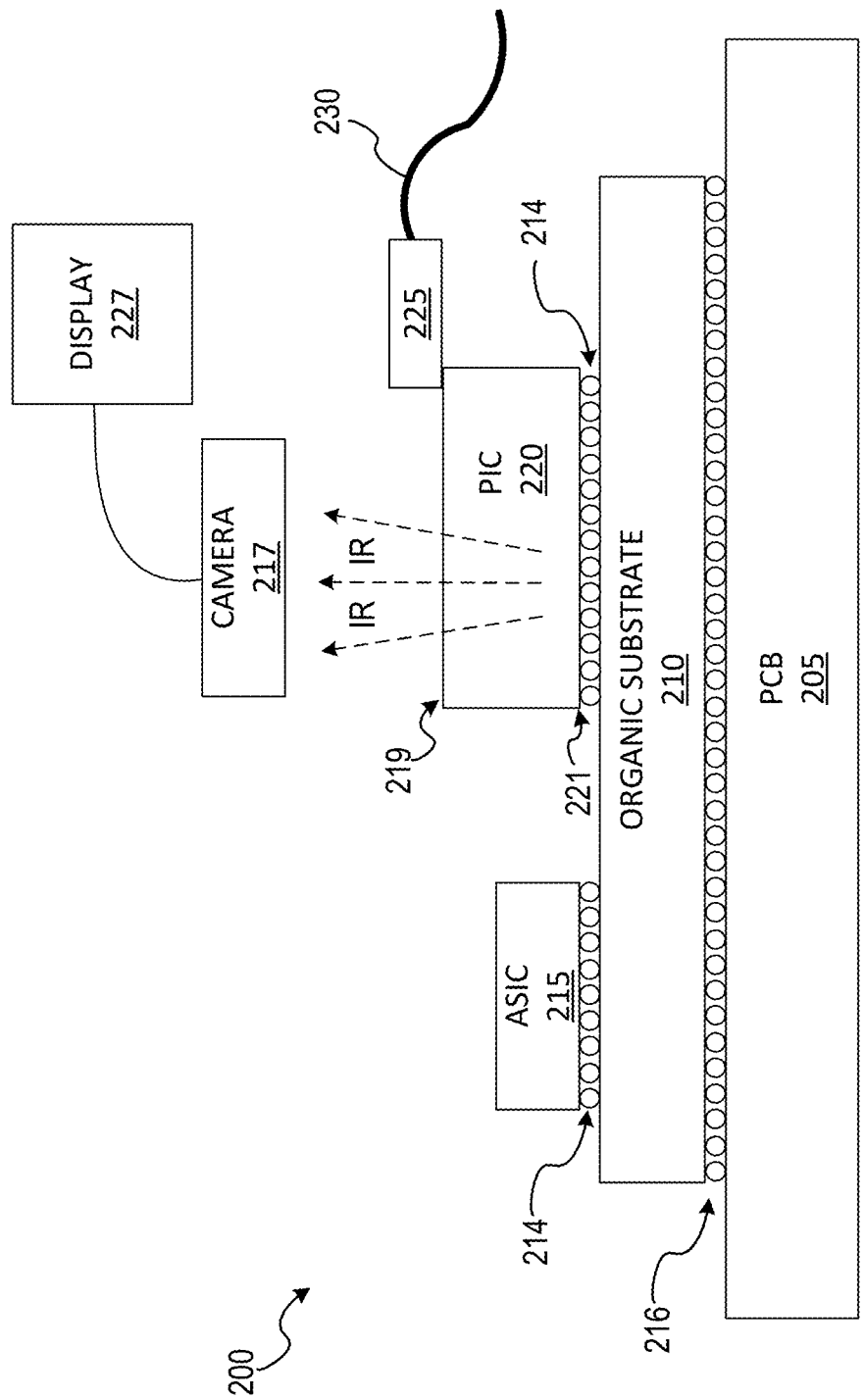
FIG. 2 is an illustration of an optical-electrical device including one or more optical devices, according to an embodiment of the disclosure.

FIG. 2 is an illustration of an optical-electrical device 200 including one or more optical devices, according to some example embodiments. In this embodiment, the optical-electrical device 200 is a multi-structure chip package structure that includes a printed circuit board (PCB) substrate 205, organic substrate 210, application specific integrated circuit (ASIC) 215, and photonic integrated circuit (PIC) 220. In this embodiment, the PIC 220 may include one or more optical structures described above (e.g., PIC 110). Further, although only a single ASIC 215 is illustrated in FIG. 2, it is appreciated that multiple ASICs can be integrated in the optical-electrical device 200 (e.g., an transmitter ASIC for the data transmitter 105, a receiver ASIC for data receiver 115, a microprocessor ASIC for microprocessor 102), according to different embodiments and configurations.

In some example embodiments, the PIC 220 includes silicon on insulator (SOI) or silicon-based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP)). The carrier dispersion effects of III-V-based materials may be significantly higher than in silicon-based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices; in embodiments of the disclosure, said heterogeneous devices utilize low loss heterogeneous optical waveguide transitions between the devices' heterogeneous and silicon-only waveguides. In some example embodiments, the PIC 110 implements an integrated laser (not depicted in FIG. 2) to generate light using the III-V material.

In some example embodiments, the optical devices of PIC 220 are controlled, at least in part, by control circuitry included or control instructions from one or more ASICs, such as ASIC 215. Both ASIC 215 and PIC 220 are shown to be disposed on copper pillars 214, which are used for communicatively coupling the ICs via organic substrate 210. PCB substrate 205 is coupled to organic substrate 210 via ball grid array (BGA) interconnect 216, and may be used to interconnect the organic substrate 210 (and thus, ASIC 215 and PIC 220) to other components of optical-electrical device 200 not shown, such as interconnection modules, power supplies, and so forth.

In the illustrated example, the PIC 220 is in a flip-chip configuration in which a front-side 221 faces "down" to connect to the organic substrate 210 and the backside 219 faces "up" away from the organic substrate 210. The light from the integrated light source can be of a wavelength (e.g., infrared) that can propagate or otherwise passthrough other layers of the PIC 220 (e.g., substrate, silicon oxide) to shine out the backside 219. An image sensor 217 such as a camera can capture the light using image elements (e.g., CCD array) to generate a photonic circuit image of the photonic circuit within the PIC 220, even though the photonic circuit layer may be covered up for otherwise not visible through the backside 219. The generated image from the camera or image sensor 217 can be displayed on display 227, such as a monitor of a desktop computer, which can perform image analysis on the photonic images to identify and label optical defects (e.g., waveguide errors). For example, edge detection or convolutional neural network object identification can be applied to each photonic circuit image to identify an active area of the photonic circuit and optical errors in waveguides, according to some example embodiments.

Further, although the PIC 220 is illustrated as being imaged in a flip-chip configuration on the organic substrate 210, it is appreciated that the on-chip light source, camera, and display 227 can likewise image the PIC 220 through the front-side 221 which may be covered with electrical contacts, traces, which can make it otherwise not practical to see the photonic layer.

For example, on-chip light from PIC 220 can be used to generate a photonic circuit image while the PIC 220 is part of a wafer (e.g., in-line, in a wafer fabrication environment or cleanroom, before die singulation).

Figure 3:
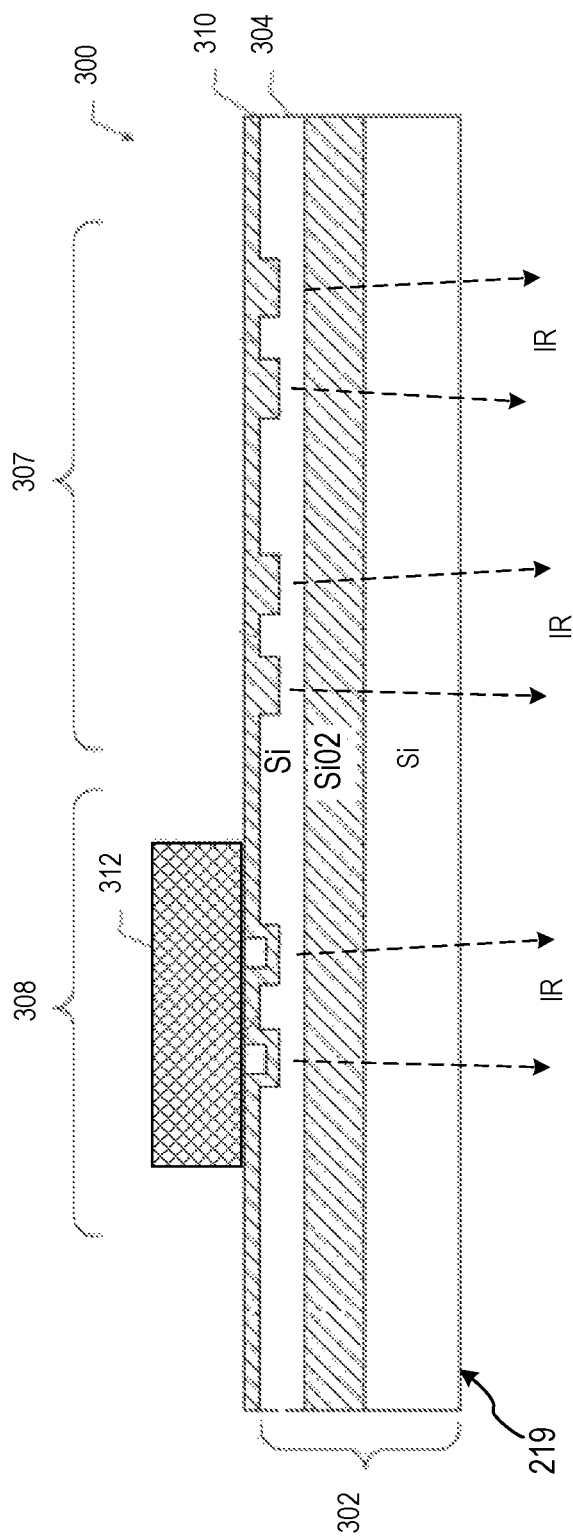
FIG. 3 is a schematic cross-sectional view a photonic integrated circuit, in accordance with various embodiments.

FIG. 3 is a schematic cross-sectional view a PIC 300, in accordance with various embodiments. The PIC 300 is an example of PIC 220 in which the side 219 is facing down and the top side faces up, where some layers of the top-side are removed (e.g., electrical interface) for visibility. As illustrated, the PIC 300 is a silicon on insulator substrate 302 (which includes layers of silicon, silicon oxide, and silicon) is shown in cross-sectional view. The top silicon layer 304 of the SOI substrate 302 is patterned and then partially etched to form the waveguides and other integrated optical structures (e.g., an MZI) in region 307. Further, the top silicon layer 304 further includes a waveguide to couple light from portions of a laser diode (e.g., the III-V material), an associated modulator (e.g., used to send data and optionally apply a low frequency dither signal to the laser) and photodiodes (e.g., serving as the detectors) in region 308. The laser can be tuned using semiconductor material in region 308 to exploit linear and/or quadratic electro-optic effects or carrier injection (via free carrier absorption, bandgap shrinkage, band filling effects), or by a thermal tuning element in region 307 placed within the laser cavity. The output coupler may be, for example, a multimode interface (MMI) that takes the form of a rectangle (in top view, e.g., as shown in FIG. 3) that merges into the (narrower, and optionally tapered) waveguides at the input and output ports.

On top of the patterned and etched silicon layer, an insulating layer of silicon-oxide may be deposited to form a cladding 310. In the region 308 of the laser and detectors, on top of the cladding 310 above the integrated optical structures of these components, compound semiconductor material 312 (e.g., III-V material) including n-doped and p-doped regions is deposited to form the laser diodes, modulators, and photodiodes; typically, the compound semiconductor includes multiple different materials bonded to the surface and optimized for each function. Pad metal and metal contacts (not shown) are deposited to facilitate applying a current through the laser diode to cause stimulated emission, applying a current or voltage to laser tuning elements, generating a variable electric field across the modulator to transmit data and optionally provide dithering, and measuring currents generated in the photodiodes. Light created in the laser diode is coupled into the integrated optical structures beneath, which may form a resonant cavity with an output coupler leading to the modulator, optional optical switches and power dividers, and other optical components as shown in FIG. 4.

Figure 4:
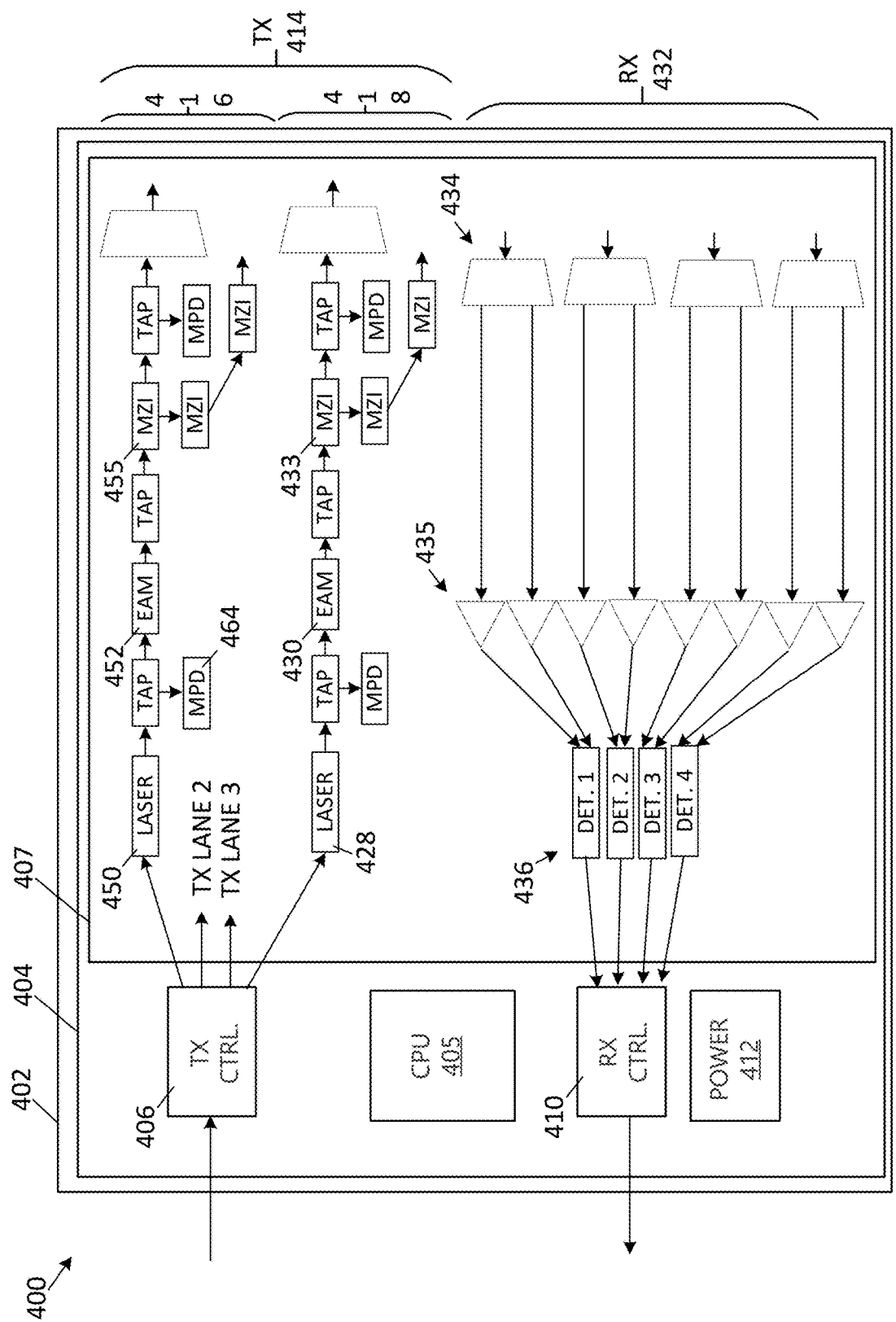
FIG. 4 shows internal architecture of an optical-electrical device, according to some example embodiments.

FIG. 4 shows internal architecture 400 of an optical-electrical device 402, according to some example embodiments. As illustrated, the architecture 400 displays an optical-electrical device 402 that can send and receive optical data, such as optical transceiver 100. The optical-electrical device 402 comprises an electronics module 404 and a photonics module 407. The electronics module 404 includes electrical components (e.g., electrical conduction pathways/traces, circuit control logic, ASICs, processors, power control circuits, etc.), which can be integrated as one or more electrical structures or ASICs in a packaged chip, such as ASIC 215 of FIG. 2. In the example illustrated, the electronics module 404 includes a transmitter controller 406 (e.g., data transmitter 105, FIG. 1) that receives data for optical modulation (e.g., PAM4 data, QPSK data). In some example embodiments, a hardware processor 405 (e.g., a CPU, ASIC, microprocessor) controls different processes of the optical-electrical device 402. The electronics module 404 further includes a receiver controller 410 (e.g., data receiver 115), which can receive optical data generated by the optical receiver components in the photonics module 407. Electronics module 404 can further include a power control circuit 412 to supply and control electrical power for the optical-electrical device 402, including electronic components in the electronics module 404, and further supply electrical power to be photonics module 407 to power various electrically controlled photonic components (e.g., lasers, silicon optical amplifiers, filters, modulators, and so forth).

In some example embodiments, the photonics module 407 is a wavelength division multiplexing transceiver architecture comprising an integrated photonics transmitter structure 414 and an integrated photonics receiver structure 432. In some example embodiments, the integrated photonics transmitter structure 414 and the integrated photonics receiver structure 432 are example optical components fabricated in a PIC device, such as PIC 220 of FIG. 2, discussed above. The integrated photonics transmitter structure 414 is an example of a transmitter having four lanes, in which each lane handles a different wavelength of light using different optical components including, for example, laser 450, an electro-absorption modulator (EAM) 452, and an MZI 455 in the first transmitter lane 416, and other lanes may include the same or similar components to manage optical data on those lanes (e.g., at different wavelength division multiplexing wavelengths). For brevity, in the example illustrated, only two lanes of the transmitter are illustrated, including the first transmitter lane 416 and the fourth transmitter lane 418; the second and third transmitter lanes are omitted.

The integrated photonics receiver structure 432 is an example of an optical receiver that receives modulated light (e.g., from an optical network) and processes the light by filtering, amplifying, and converting it to electrical signal using components such as multiplexers 434, semiconductor optical amplifiers (SOAs) 435, and one or more detectors such as photodetectors 436 (e.g., photodiodes).

The photonics module 407 can be fabricated in multiple processes, including first fabricating one or more silicon components followed by fabricating active components from III-V layers. For example, the waveguides connecting the various components in the photonics module 407 (e.g., illustrated as arrows) can be etched from silicon, and other components such as MZI 455 and MZI 433 can likewise be etched from silicon; while other components, such as the lasers (e.g., laser 428, 450), monitor photodiodes (e.g., monitor photodiode 464), and photodetectors 436 can be subsequently fabricated in a subsequent fabrication cycle from a III-V material after the silicon components (e.g., waveguides are etched).

In some example embodiments, one or more of the lasers (e.g., laser 450) is activated to provide light to the components of the transmitter lane 416. The power supplied to bias the laser 450 can lower than the lasing threshold to generate low level light that propagates through the optical path to enable accurate higher resolution of the photonic circuit using an infrared imager that can receive light scattered from the photonic layer. In some example embodiments, each lane is tested individually by turning on each lane's laser and then evaluating the components of the lane from the photonic images generated from the infrared light. In some example embodiments, each transmitter lane includes a loopback path to one of the plurality of receiver lanes, such that when a given laser lane is activated the light propagates through the transmitter lane and also through the receiver components via the loopback path. In this way, each component and optical path can be validated via the photonic circuit images.

Figure 5A:
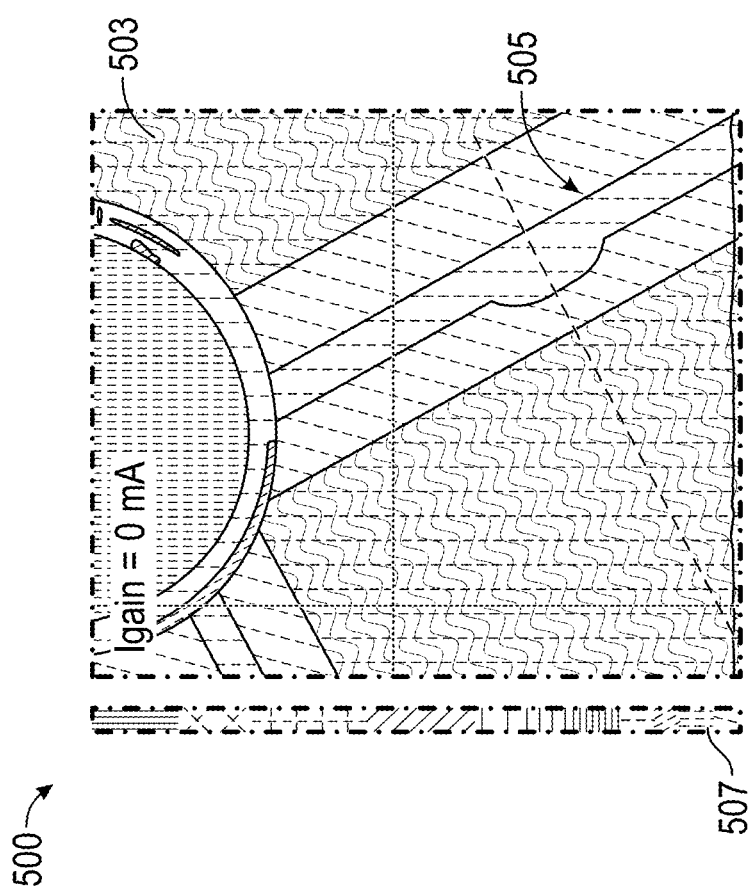
FIGS. 5A and 5B show photonic circuit images for detecting point errors, according to some example embodiments.

FIG. 5A shows an example photonic circuit image 500 for detecting point errors, according to some example embodiments. In the example of FIG. 5A, with integrated semiconductor laser (e.g., laser 450) is not provided power, however a waveguide 505 is still visible due to ambient infrared light reflecting from the materials of the photonic integrated circuit 503 (e.g., silicon, silicon oxide, III-V material) from an external illumination source. In example of FIG. 5B, the integrated semiconductor light sources provided sub-lasing threshold power (e.g., 2 mA) to cause the laser to generate low-power light which propagates through the photonic integrated circuit, including the waveguide 505. As depicted in the photonic circuit image 550, the low-power infrared light scatters from a defect 555 in the waveguide towards the infrared camera (e.g., through one or more layers of substrate 302 and through the backside 219 of a flip chip PIC). In some example embodiments, the photonic circuit image is colored in relation to the intensity of each pixel, to provide false color such that the intensity of scattered light in the different areas can be estimated by direct visual observation of the image 500. In some example embodiments, a spectrum indicator 507 is included with the image 500 (e.g., displayed on display 227) to assist the user in determining the approximate intensity of light in the image 500. For example, the majority of the circuit 503 can be different shades of purple and the defect 555 can be displayed with a different color (e.g., white) which can be visually distinguished. In some example embodiments, the defect 555 is labeled with a user interface element (e.g., a circuit, an arrow) on the display 227, according to some example embodiments.

Figure 6:
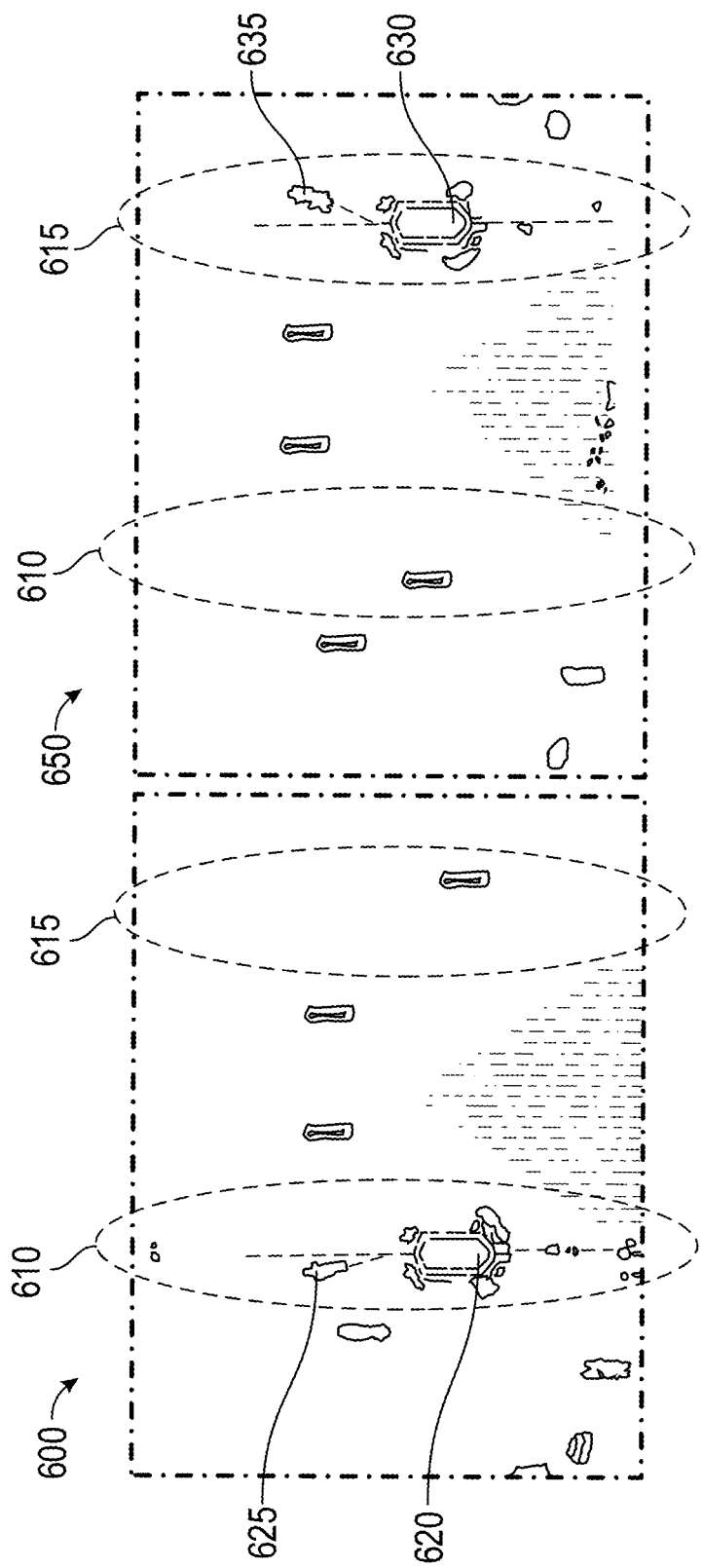
FIG. 6 shows example photonic circuit images of a photonic integrated circuit, according to some example embodiments.

FIG. 6 shows example photonic circuit images 600 and 650 of a photonic integrated circuit, according to some example embodiments. In the example of FIG. 6, both images 600 and 650 depict the same region of the PIC with different optical pathways illuminated. For example, in image 600, a first optical pathway 610 receives light from the integrated light source, and an MZI 620 and a monitor photodiode 625 are visible due to the light scattering from bends and terminating ends of the components. For example, the MZI 620 includes a Y-junction in which light scatters from the bends of the junction. Additionally, the monitor photodiode 625 is a photodetector that taps or monitors a portion of light on the pathway 610 and light scatters from the end of the monitor photodiode 625, which is visible in the image 600 from the infrared light propagating through the PIC and to the imaging sensor 217. In the example of FIG. 6, an optical switch (not depicted) can switch the light from the on-chip laser from the first optical pathway 610 to the second optical pathway 615, where the second optical pathway 615 is not visible in the image 600 (as it is not receiving light), but is illuminated in image 650. In the image 650, the second optical pathway 615 comprises an MZI 630 and a monitor photodiode 635, both of which scatter light at bends and terminating ends of the respective components. By illuminating different components and pathways using the on-chip source, the different components of the PIC can be validated. For example, if an optical-electrical chip is malfunctioning and it unclear whether the PIC is operating correctly, the different parts can be imaged to verify that the pathways are receiving light, which can then be used to conclude that the malfunctioning components may be electrical components outside of the PIC (e.g., in the ASIC). Alternatively, if after generating image 600, the switch is activated to direct light through the second optical pathway 615, yet the second optical pathways 615 remains dark, then it can be concluded that there is an error in the pathway (e.g., point error, material based error) or component error (e.g., switch error), according to some example embodiments.

Figure 7:
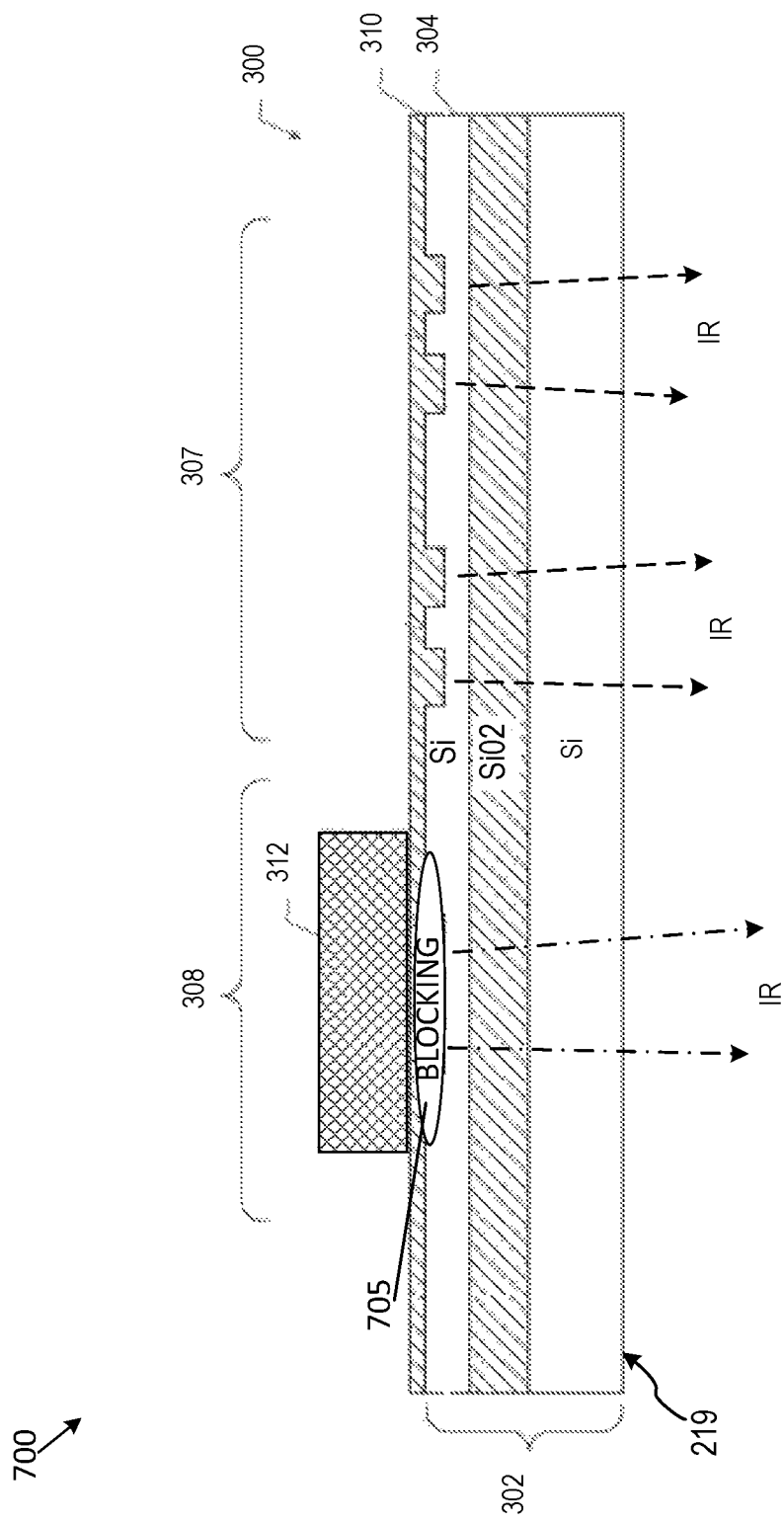
FIG. 7 shows an example photonic circuit architecture for detecting material-based optical errors, according to some example embodiments.

FIG. 7 shows an example photonic circuit architecture 700 for detecting material-based optical errors, according to some example embodiments. As discussed above, each of the waveguide paths (e.g., paths along region 307 and region 308, FIG. 3) can generate or otherwise propagate infrared light, which can be transmitted through one or more layers of the PIC (e.g., SiO2 and one or more Si layers of substrate 302) through the backside 219 of the photonic integrated circuit for imaging by the image sensor 217. However, in the example of FIG. 7, a blocking material 705 (e.g., bonding adhesive residue or air gaps from insufficient bonding) causes errors which can be imaged by light that propagates or is otherwise blocked by the blocking material 705. For example, the light propagating through the photonic integrated circuit can be infrared light of a given set of wavelengths, and when the light encounters the material 705 it changes the wavelength of the light, which can be depicted as an area of the photonic integrated circuit having different coloration (e.g. as compared to the other areas of the PIC within the image). In some example embodiments in which the laser is tunable, different wavelengths of light can be generated by the integrated light source and the material can be imaged using the different wavelengths to better isolate where the material 705 is located within the photonic integrated circuit. Additionally, and in accordance with some example embodiments, the light source can be swept through different wavelengths while the infrared camera records video, and the material 705 can be imaged as it responds differently (from the other the other materials of the PIC) at each wavelength during the sweep such that the material is more easily distinguished from the other materials over the frames of video. In some example embodiments, a characteristic such as the physical composition of the material 705 can be determined based on a change in wavelengths of the light emanating and depicted from the area around the material 705. For example, if the material 705 is an adhesive that is known to change or shift the wavelength of infrared light by an approximate amount (e.g., a shift of 20 nm) the material composition of the blocking material 705 can be identified based on the shift (e.g., difference in color) of the material 705 as compared to the other portions of the photonic integrated circuit.

Figure 8:
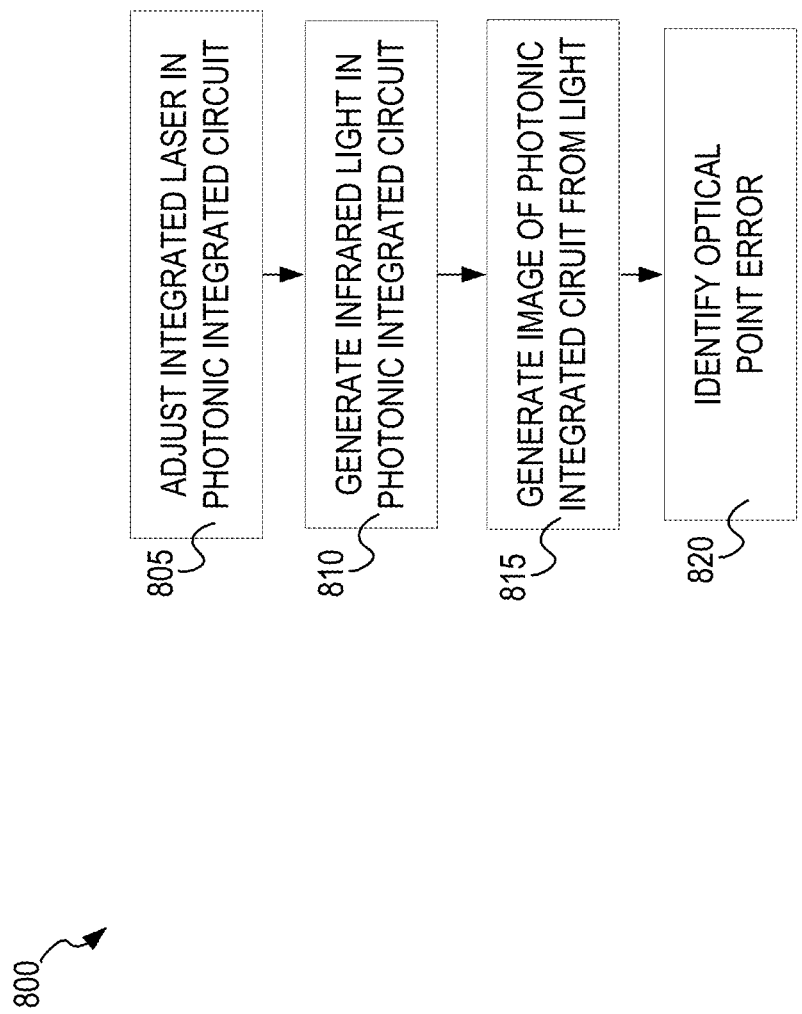
FIG. 8 shows an example flow diagram of a method for determining optical point errors, according to some example embodiments.

FIG. 8 shows an example flow diagram of a method 800 for determining optical point errors, according to some example embodiments. The optical point errors could include a scatter point (e.g., break or hole) of a waveguide, light scattering from a bend or terminating portion of the photonic integrated circuit, or a lack of light from a given component bend/end (e.g., light not emanating from an MZI to which light is being directed by an optical switch).

At operation 805, the integrated laser in the photonic integrated circuit is adjusted. For example, the on-chip integrated laser is tuned to generate light at infrared wavelengths. At operation 810, the infrared light is generated using the integrated laser within the photonic integrated circuit. Upon the light being generated at operation 810, the light propagates and illuminates different portions of the photonic integrated circuit (e.g., illuminates the entire photonic integrated circuit, illuminates different portions of light receiving light directed from optical switches). In some example embodiments, the light is generated at a low power level such that the light generated is non-coherent (e.g., not laser light) such that the path of the light as it traverses a circuit is more defined (e.g., a higher resolution due to the laser light not shining and over-saturating imaging elements of the image sensor).

At operation 815, a photonic integrated circuit image is generated from the light propagating through the photonic circuit.

For example, light scattering from bends holes or terminating ends propagates through the substrate material of the backside of a flip chip photonic integrated circuit into the infrared camera which generates an image.

Figure 5B:
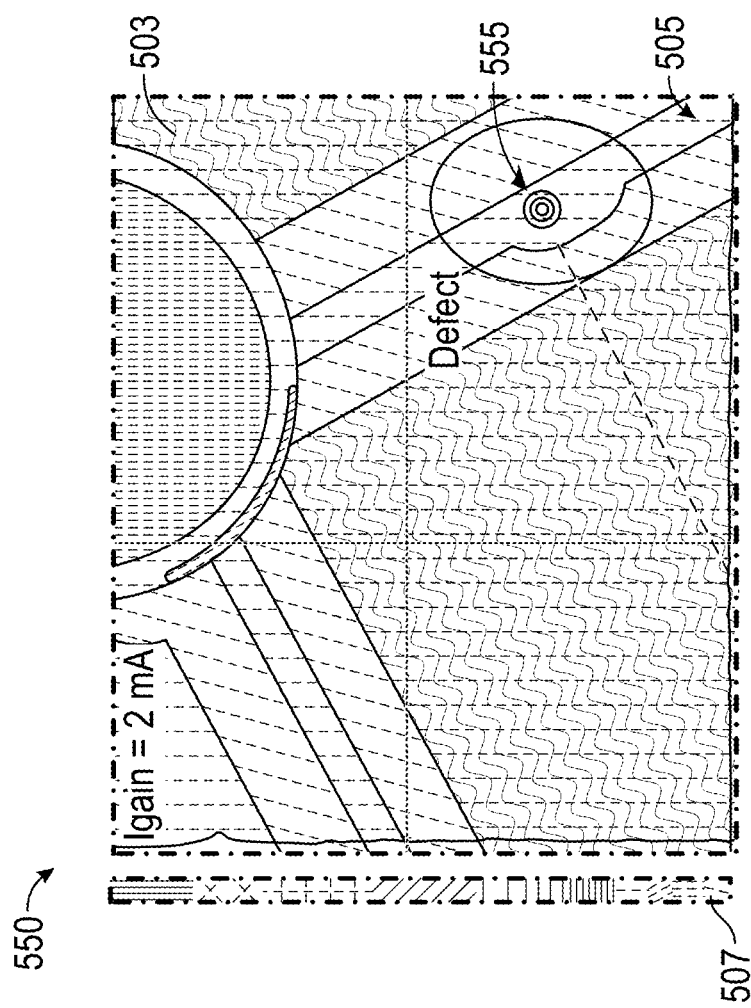

At operation 820, optical point errors are identified in the image. For example, an optical point error can include a hole from a waveguide as illustrated in FIG. 5B. As an additional example, an optical point error can include light emanating from a bend or an end in the photonic integrated circuit when the light should not be emanating from the given area. As an additional example, the optical error can be identified in the image as a lack of light from a region of the PIC that is supposed to be receiving light in the testing setup (e.g., light is directed towards the second pathway 615, however the second pathway is dark in the image, or one or more components in the second pathway are dark in the image, which indicates that the error is in the component.

Figure 9:
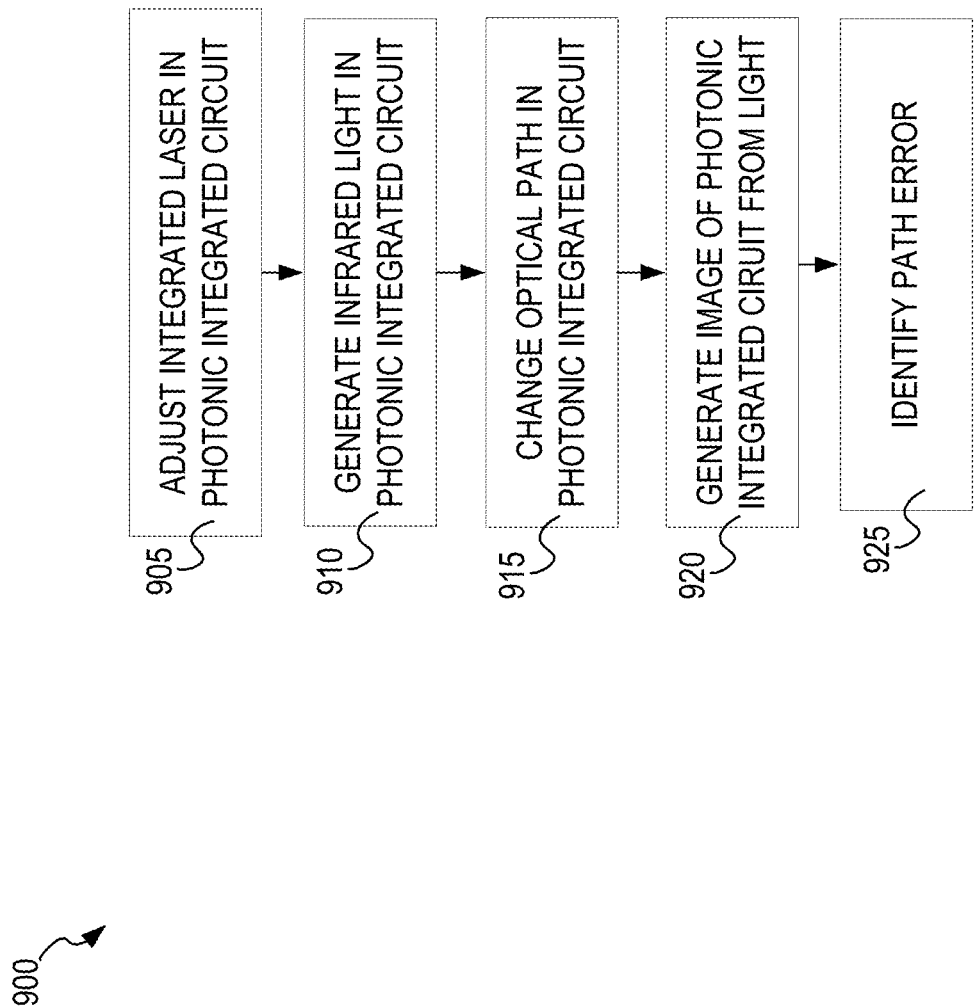
FIG. 9 shows an example flow diagram of a method for determining optical path errors, according to some example embodiments.

FIG. 9 shows an example flow diagram of a method 900 for determining optical path errors, according to some example embodiments. At operation 905, the integrated laser in the photonic integrated circuit is adjusted. For example, at operation 905 the integrated laser is a tunable wavelength laser that is adjusted to generate infrared light at infrared wavelengths.

At operation 910, the infrared light is generated using the integrated laser within the photonic integrated circuit. Upon the infrared light being generated at operation 910, the light propagates and illuminates different portions of the photonic integrated circuit (e.g., illuminates the entire photonic integrated circuit, illuminates different portions of the circuit that are receiving light directed from one or more optical switches).

At operation 915, an optical path is changed the photonic integrated circuit. For example, an optical switch changes the active optical pathway from the first optical pathway 610 to a second optical pathway 615, as discussed above.

At operation 920, photonic integrated circuit images generated from the light propagating through the activated pathway. For example, infrared light scattering from bends, holes, or terminating ends of the activated optical pathway propagates through the substrate material of the photonic integrated circuit and out through the backside of the flip chip photonic integrated circuit into the infrared camera which generates the image for display in storage.

At operation 925, one or more optical path errors identified in the generated image. For example, an optical path error can include one or more of the components in the activated optical pathway being dark or otherwise not receiving light which indicates that the one or more components are faulty. Additionally, an optical pathway error can include the entire pathway being darkened in the image, which indicates that the pathway is not receiving light from the one or more switch components.

FIG. 10 shows an example flow diagram of a method 1000 determining material-based optical errors in a photonic integrated circuit, according to some example embodiments.

At operation 1005, infrared light is generated using the integrated laser source that is tuned to generate light at a first set of infrared wavelengths. At operation 1010, photonic integrated circuit image is generated from the light propagating through the photonic integrated circuit (e.g., via image sensor 217).

At operation 1015, infrared light is generated using the integrated laser source that is tuned to generate light at a second set of infrared wavelengths (e.g., higher or lower than the first set of wavelengths).

At operation 1020, an additional photonic integrated circuit is generated from the light propagating through the integrated circuit that the second set of wavelengths. At operation 1025, one or more material based optical errors identified, as discussed above with reference to FIG. 7. Although in the example of FIG. 10 two images are generated, in some example embodiments, the wavelengths propagating through the photonic integrated circuit are swept using the tunable light source while the infrared camera generates video, which is then displayed as live or real-time video on a display device to identify the materials location and characteristics.

The following are example embodiments:

Example 1. A method for detecting errors in a photonic integrated circuit (PIC), comprising: generating, by an integrated semiconductor laser of the PIC, infrared light that propagates along a photonic circuit layer of the PIC that comprises a plurality of optical components connected by a plurality of waveguides, the photonic circuit layer formed on a substrate layer of the PIC, a portion of the infrared light propagating away from the photonic circuit layer through the substrate layer of the PIC; generating a photonic circuit image by imaging, using an image sensor external to the PIC, the portion of the infrared light that propagates from the photonic circuit layer through the substrate layer of the PIC; and displaying the photonic circuit image on a display device, the photonic integrated circuit displaying an optical error in the one or more components of the photonic circuit layer of the PIC.

Example 2. The method of example 1, wherein the PIC is included in a PIC chip in a flip-chip configuration with a first side having electrical connections that connect with an external chip and a second side that is opposite of the first side that faces away from the external chip, the image sensor generating the photonic circuit image while facing the second side of the PIC chip.

Example 3. The method of any of examples 1 or 2, wherein the photonic circuit layer is covered by the substrate layer from a perspective of the image sensor facing the second side of the PIC chip.

Example 4. The method of any of examples 1-3, wherein the substrate layer blocks visible light having visible wavelengths and passes the portion of the infrared light based on the infrared light having infrared wavelengths higher than the visible wavelengths.

Example 5. The method of any of examples 1-4, wherein the photonic circuit image is generated based on the portion of the infrared light from the integrated semiconductor laser scattering to the image sensor.

Example 6. The method of any of examples 1-5, wherein the image sensor is an infrared image sensor that is sensitive to infrared wavelengths of the infrared light.

Example 7. The method of any of examples 1-6, wherein the integrated semiconductor laser is provided sub-lasing threshold power such that the infrared light is generated without lasing.

Example 8. The method of any of examples 1-7, wherein the optical error is a waveguide error in one of the plurality of waveguides, the photonic circuit image depicting increased scattering of the portion of the infrared light from the waveguide error.

Example 9. The method of any of examples 1-8, wherein the optical error is depicted as decreased scattering of an area of the photonic circuit layer due to material blocking some of the infrared light.

Example 10. The method of any of examples 1-9, wherein the integrated semiconductor laser is a tunable laser.

Example 11. The method of any of examples 1-10, the method further comprising: generating an initial photonic circuit while the tunable laser of the PIC is tuned to one or more initial wavelengths, wherein the photonic circuit image depicting the optical error is generated while the tunable laser is tuned to generate the infrared light at infrared wavelengths that are different than the initial wavelengths, wherein the area with decreased scattering changes appearance in the photonic circuit image due the material.

Example 12. The method of any of examples 1-11, further comprising: generating an initial photonic circuit image by guiding the infrared light to a first optical path in the photonic circuit layer using one of the plurality of optical components; directing the infrared light to a second optical path in the photonic circuit layer using the one of the plurality of optical components, wherein the photonic circuit image depicting the optical error is generated by the image sensor while the infrared light is directed to the second optical path.

Example 13. The method of any of examples 1-12, wherein the one of the plurality of optical components is an optical switch that directs light to the first optical path and the second optical path in the photonic circuit layer.

Example 14. The method of any of examples 1-13, wherein the photonic circuit layer comprises a silicon layer and an active layer.

Example 15. The method of any of examples 1-14, wherein the plurality of waveguides are formed in the silicon layer, and wherein one or more of the plurality of optical components are formed from the active layer.

Example 16. The method of any of examples 1-15, wherein the integrated semiconductor laser is formed from a portion of the active layer.

Example 17. A system for detecting photonic integrated circuit optical errors, comprising: a photonic integrated circuit comprising a photonic circuit layer that includes a plurality of optical components connected by a plurality of waveguides, the photonic circuit layer formed on a substrate layer of the PIC, the plurality of optical components including an integrated semiconductor laser that generates infrared light that propagates through the photonic circuit layer; an external image sensor to generate a photonic circuit image from the infrared light from the photonic circuit layer, the external image sensor positioned to image the infrared light propagating in the photonic circuit layer and scattering through the substrate layer of the photonic integrated circuit to the external image sensor.

Example 18. The system of any of examples 1-17, the system further comprising: a display device connected to the external image sensor, the external image sensor and the display device positioned near the photonic integrated circuit in a fabrication environment, the photonic integrated circuit included a wafer comprising a plurality of circuits.

Example 19. The system of any of examples 1-17, wherein the photonic integrated circuit is a die singulated from a wafer, and the photonic integrated circuit is in a photonic chip with that is electrically connected to another chip on an electrical interface side that is closer to the photonic circuit layer, the substrate layer being separated from the another ship by the photonic circuit layer, wherein the external image sensor generates the photonic circuit image while the photonic integrated circuit is connected to the another chip.

Example 20. The system of any of examples 1-17, wherein the image sensor is an infrared image sensor that is sensitive to infrared wavelengths of the infrared light, and wherein the integrated semiconductor laser is provided sub-lasing threshold power to generate the infrared light without lasing.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method for detecting errors in a photonic integrated circuit (PIC), the method comprising:
generating, by an integrated semiconductor laser of the PIC, infrared light that propagates along a photonic circuit layer of the PIC that comprises a plurality of optical components connected by a plurality of waveguides, the photonic circuit layer formed on a substrate layer of the PIC, a portion of the infrared light propagating away from the photonic circuit layer through the substrate layer of the PIC;
generating an initial photonic circuit image by imaging, using an image sensor external to the PIC, the portion of the infrared light that propagates away from the photonic circuit layer through the substrate layer of the PIC, the initial photonic circuit image generated while the infrared light is guided to a first optical path in the photonic integrated circuit by one or more of the plurality of optical components;
directing the infrared light to a second optical path in the photonic circuit layer using the one of the plurality of optical components;
generating a photonic circuit image while the infrared light is guided to the second optical path; and
displaying the photonic circuit image on a display device while the infrared light is guided to the second optical path, the photonic circuit image displaying an optical error in the one or more components of the photonic circuit layer of the PIC.

2. The method of claim 1, wherein the PIC is included in a PIC chip in a flip-chip configuration with a first side having electrical connections that connect with an external chip and a second side that is opposite of the first side that faces away from the external chip, the image sensor generating the photonic circuit image while facing the second side of the PIC chip.

3. The method of claim 2, wherein the photonic circuit layer is covered by the substrate layer from a perspective of the image sensor facing the second side of the PIC chip.

4. The method of claim 2, wherein the substrate layer blocks visible light having visible wavelengths and passes the portion of the infrared light based on the infrared light having infrared wavelengths higher than the visible wavelengths.

5. The method of claim 4, wherein the photonic circuit image is generated based on the portion of the infrared light from the integrated semiconductor laser scattering to the image sensor.

6. The method of claim 1, wherein the image sensor is an infrared image sensor that is sensitive to infrared wavelengths of the infrared light.

7. The method of claim 6, wherein the integrated semiconductor laser is provided sub-lasing threshold power such that the infrared light is generated without lasing.

8. The method of claim 1, wherein the optical error is a waveguide error in one of the plurality of waveguides, the photonic circuit image depicting increased scattering of the portion of the infrared light from the waveguide error.

9. The method of claim 1, wherein the optical error is depicted in the photonic circuit image as decreased scattering of an area of the photonic circuit layer due to a physical material in the PIC blocking some of the infrared light.

10. The method of claim 9, wherein the integrated semiconductor laser is a tunable laser.

11. The method of claim 1, wherein the one of the plurality of optical components is an optical switch that directs light to the first optical path and the second optical path in the photonic circuit layer.

12. The method of claim 1, wherein the photonic circuit layer comprises a silicon layer and an active layer.

13. The method of claim 12, wherein the plurality of waveguides are formed in the silicon layer, and wherein one or more of the plurality of optical components are formed from the active layer.

14. The method of claim 12, wherein the integrated semiconductor laser is formed from a portion of the active layer.

15. A system for detecting photonic integrated circuit (PIC) optical errors, the system comprising:
a PIC comprising a photonic circuit layer that includes a plurality of optical components connected by a plurality of waveguides, the photonic circuit layer formed on a substrate layer of the photonic integrated circuit, the plurality of optical components including an integrated semiconductor laser that generates infrared light that propagates through the photonic circuit layer; and
an external image sensor to generate an initial photonic circuit image from the infrared light from the photonic circuit layer while the infrared light is guided to a first optical path in the PIC by one or more of the plurality of optical components and to further generate a photonic circuit image from the infrared light while the infrared light is guided to a second optical path in the PIC by the one or more of the plurality of optical components, the external image sensor positioned to generate the photonic circuit image as the infrared light that is guided to the second optical path propagates in the photonic circuit layer and scatters through the substrate layer of the PIC to the external image sensor.

16. The system of claim 15, the system further comprising: a display device connected to the external image sensor, the external image sensor and the display device positioned near the PIC in a fabrication environment.

17. The system of claim 15, wherein the PIC is a die singulated from a wafer, and the PIC is in a photonic chip that is electrically connected to another chip, wherein the external image sensor generates the photonic circuit image while the PIC is connected to the another chip.

18. The system of claim 15, wherein the external image sensor is external to the PIC, wherein the external image sensor is an infrared image sensor that is sensitive to infrared wavelengths of the infrared light.

19. The system of claim 15, wherein the integrated semiconductor laser is provided sub-lasing threshold power to generate the infrared light without lasing.

20. The method of claim 9, wherein the physical material comprises residue from a bonding adhesive in the PIC.

\* \* \* \* \*